(12) United States Patent
Fujikawa

(10) Patent No.: US 8,043,949 B2
(45) Date of Patent: Oct. 25, 2011

(54) METHOD OF MANUFACTURING SILICON CARBIDE SEMICONDUCTOR DEVICE

(75) Inventor: Kazuhiro Fujikawa, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 238 days.

(21) Appl. No.: 12/516,684

(22) PCT Filed: Aug. 13, 2007

(86) PCT No.: PCT/JP2007/065818
§ 371 (c)(1),
(2), (4) Date: May 28, 2009

(87) PCT Pub. No.: WO2008/065782
PCT Pub. Date: Jun. 5, 2008

(65) Prior Publication Data
US 2010/0062582 A1    Mar. 11, 2010

(30) Foreign Application Priority Data
Nov. 29, 2006  (JP) .................................. 2006-322095

(51) Int. Cl.
*H01L 29/732*  (2006.01)

(52) U.S. Cl. .. 438/589; 438/268; 438/270; 257/E21.061

(58) Field of Classification Search .................. 438/268, 438/270, 430, 589; 257/329, 330, E21.06, 257/E21.061, E21.065, E21.054
See application file for complete search history.

(56) References Cited

U.S. PATENT DOCUMENTS

| | | | | |
|---|---|---|---|---|
| 5,723,376 A | * | 3/1998 | Takeuchi et al. | 438/270 |
| 5,744,826 A | | 4/1998 | Takeuchi et al. | |
| 5,976,936 A | * | 11/1999 | Miyajima et al. | 438/268 |
| 6,057,558 A | | 5/2000 | Yamamoto et al. | |
| 7,241,694 B2 | * | 7/2007 | Takeuchi et al. | 438/700 |
| 7,902,025 B2 | * | 3/2011 | Hayashi et al. | 438/270 |
| 2001/0053561 A1 | * | 12/2001 | Kitabatake et al. | 438/99 |
| 2005/0064639 A1 | | 3/2005 | Hisada et al. | |
| 2005/0181536 A1 | * | 8/2005 | Tsuji | 438/105 |
| 2005/0230686 A1 | | 10/2005 | Kojima et al. | |

FOREIGN PATENT DOCUMENTS

| | | |
|---|---|---|
| JP | 9-199724 | 7/1997 |
| JP | 10-247732 | 9/1998 |
| JP | 2003-224277 | 8/2003 |

* cited by examiner

*Primary Examiner* — Jarrett Stark
*Assistant Examiner* — Michele Fan
(74) *Attorney, Agent, or Firm* — Venable LLP; Michael A. Sartori

(57) ABSTRACT

There is provided a method of manufacturing a silicon carbide semiconductor device including the steps of: in a semiconductor stacked substrate including a first conductivity type silicon carbide crystal substrate, a first conductivity type silicon carbide crystal layer, a second conductivity type silicon carbide crystal layer, and a first conductivity type semiconductor region, forming a trench extending through the first conductivity type semiconductor region and the second conductivity type silicon carbide crystal layer into the first conductivity type silicon carbide crystal layer defined as a bottom surface; forming a silicon film on at least a part of the trench; heating the semiconductor stacked substrate having the silicon film formed to a temperature that is not less than the melting temperature of the silicon film; removing the heated silicon film; forming a gate insulating film on a surface exposed after the silicon film is removed; and forming a gate electrode layer on a surface of the gate insulating film.

3 Claims, 6 Drawing Sheets

METHOD OF MANUFACTURING SILICON CARBIDE SEMICONDUCTOR DEVICE

TECHNICAL FIELD

The present invention relates to a method of manufacturing a silicon carbide semiconductor device, and more particularly to a method of manufacturing a silicon carbide semiconductor device in which mobility of carriers in a channel of the silicon carbide semiconductor device can be improved.

BACKGROUND ART

For example, a trench-gate power MOSFET (Metal Oxide Semiconductor Field Effect Transistor) that achieves low on-resistance and high breakdown voltage has been proposed as a conventional silicon carbide semiconductor device (see Patent Document 1 (Japanese Patent Laying-Open No. 9-199724) and Patent Document 2 (Japanese Patent Laying-Open No. 10-247732), for example).

As shown in FIG. 16, for example, this conventional trench-gate power MOSFET is formed of a semiconductor stacked substrate 4 including an $n^+$-type silicon carbide crystal substrate 1, an $n^-$-type silicon carbide crystal layer 2 formed on $n^+$-type silicon carbide crystal substrate 1, a p-type silicon carbide crystal layer 3 formed on $n^-$-type silicon carbide crystal layer 2, and an $n^+$-type source region 5 and a $p^+$-type region 6 formed in a surface of p-type silicon carbide crystal layer 3. A hexagonal silicon carbide crystal is used as a silicon carbide crystal and an upper surface (a principal surface) of semiconductor stacked substrate 4 is a carbon surface of a substantial (0001−) surface.

In this conventional trench-gate power MOSFET, a trench 7 extending from a surface of semiconductor stacked substrate 4 through $n^+$-type source region 5 and p-type silicon carbide crystal layer 3 into $n^-$-type silicon carbide crystal layer 2 is formed. This trench 7 has side surfaces 7a perpendicular to a surface of $n^-$-type silicon carbide crystal layer 2 and a bottom surface 7b parallel to the surface of $n^-$-type silicon carbide crystal layer 2.

A thin film semiconductor layer 8 made from an n-type silicon carbide crystal is epitaxially grown on side surfaces 7a of trench 7, and a gate insulating film 9 is formed on a surface of thin film semiconductor layer 8. A gate electrode layer 10 is formed inside gate insulating film 9. An interlayer insulating film 11 is formed on gate electrode layer 10, and a source electrode layer 12 is formed on $n^+$-type source region 5 and p-type silicon carbide crystal layer 3 as well as on interlayer insulating film 11. A drain electrode layer 13 is formed on a surface of $n^+$-type silicon carbide crystal substrate 1 (a lower surface of semiconductor stacked substrate 4).

In the conventional silicon carbide semiconductor device having such a configuration, the application of an electric field to gate insulating film 9 by the application of a voltage to gate electrode layer 10 causes a storage type channel to be induced at thin film semiconductor layer 8, so that a current flows between source electrode layer 12 and drain electrode layer 13.

Patent Document 1: Japanese Patent Laying-Open No. 9-199724
Patent Document 2: Japanese Patent Laying-Open No. 10-247732

DISCLOSURE OF THE INVENTION

Problems to be Solved by the Invention

In the conventional silicon carbide semiconductor device disclosed in the above-described Patent Documents 1 and 2, side surfaces 7a of trench 7 are formed in parallel to a [11-00] direction or a [112-0] direction, and thus the properties of low on-resistance and high breakdown voltage are achieved.

In a method disclosed in Patent Documents 1 and 2, trench 7 is formed by RIE (Reactive Ion Etching). On the other hand, even if a photolithography process is employed in the RIE, it is difficult to form side surfaces 7a of trench 7 such that a direction thereof is completely aligned with the above-described prescribed direction.

Furthermore, since trench 7 is formed by the RIE in the method disclosed in Patent Documents 1 and 2, side surfaces 7a of trench 7 are damaged in some cases at the formation of trench 7.

Therefore, in the conventional silicon carbide semiconductor device disclosed in Patent Documents 1 and 2, a crystal face forming side surfaces 7a of trench 7 is shifted and/or damaged, and thus a crystal face of thin film semiconductor layer 8 formed on such a crystal face is also shifted and/or damaged in some cases. As a result, a surface level is created on the surface of thin film semiconductor layer 8 serving as a channel and the surface level blocks the movement of carriers. Thus, there exists a problem that the carriers in the channel do not have enough mobility and a silicon carbide semiconductor device having excellent properties such as low on-resistance cannot be provided.

Therefore, an object of the present invention is to provide a method of manufacturing a silicon carbide semiconductor device having excellent properties such as low on-resistance with the improved mobility of carriers in a channel.

Means for Solving the Problems

The present invention is directed to a method of manufacturing a silicon carbide semiconductor device including the steps of: in a semiconductor stacked substrate including a first conductivity type silicon carbide crystal substrate made from a hexagonal silicon carbide crystal of a first conductivity type, a first conductivity type silicon carbide crystal layer made from a hexagonal silicon carbide crystal of a first conductivity type and formed on the first conductivity type silicon carbide crystal substrate, a second conductivity type silicon carbide crystal layer made from a hexagonal silicon carbide crystal of a second conductivity type and formed on the first conductivity type silicon carbide crystal layer, and a first conductivity type semiconductor region formed on a surface of the second conductivity type silicon carbide crystal layer, forming a trench extending from a surface of the semiconductor stacked substrate through the first conductivity type semiconductor region and the second conductivity type silicon carbide crystal layer into the first conductivity type silicon carbide crystal layer defined as a bottom surface; forming a silicon film in at least a part of the trench; heating the semiconductor stacked substrate having the silicon film formed to a temperature that is not less than the melting temperature of the silicon film; removing the heated silicon film; forming a gate insulating film on a surface exposed after the silicon film is removed; and forming a gate electrode layer on a surface of the gate insulating film. By such a configuration, the mobility of carriers in a channel of the silicon carbide semiconductor device can be improved and a silicon carbide semiconductor device having excellent properties such as low on-resistance can be fabricated.

Preferably, in the method of manufacturing a silicon carbide semiconductor device of the present invention, the trench is formed such that side surfaces of the trench are parallel to a [11-00] direction. By such a configuration, shift and/or damage of a crystal face forming the surface exposed after the heated silicon film is removed can be reduced. Therefore, it is more likely that the mobility of the carriers in the channel of the silicon carbide semiconductor device can be further improved and a silicon carbide semiconductor device having excellent properties such as low on-resistance can be fabricated.

More preferably, in the method of manufacturing a silicon carbide semiconductor device of the present invention, the trench is formed in a hexagonal shape whose interior angles are equal to one another in the surface of the semiconductor stacked substrate. By such a configuration, any side surface of the trench is made equivalent in terms of the crystal engineering. Therefore, it is more likely that a silicon carbide semiconductor device having excellent properties such as low on-resistance that has more channels with the improved mobility of the carriers can be fabricated.

Effects of the Invention

According to the present invention, there can be provided a method of manufacturing a silicon carbide semiconductor device having excellent properties such as low on-resistance with the improved mobility of carriers in a channel.

DESCRIPTION OF THE REFERENCE SIGNS

Figure 1:
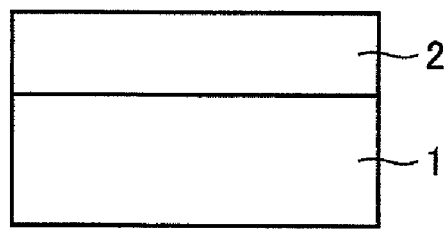
FIG. 1 is a schematic cross-sectional view showing a part of a manufacturing process of a preferable example of a trench-gate power MOSFET as a silicon carbide semiconductor device of the present invention.

1 $n^+$-type silicon carbide crystal substrate, 2 $n^-$-type silicon carbide crystal layer, 3 p-type silicon carbide crystal layer, 4 semiconductor stacked substrate, 5 $n^+$-type source region, 6 $p^+$-type region, 7 trench, 7a side surface, 7b bottom surface, 8 thin film semiconductor layer, 9 gate insulating film, 10 gate electrode layer, 11 interlayer insulating film, 12 source electrode layer, 13 drain electrode layer, 14 silicon film

BEST MODES FOR CARRYING OUT THE INVENTION

The embodiments of the present invention will be described below. The same or corresponding parts are represented by the same reference numerals in the drawings of the present invention.

Referring to FIGS. 1-12, a manufacturing process of a preferable example of a trench-gate power MOSFET as a silicon carbide semiconductor device of the present invention will be described. First, as shown in a schematic cross-sectional view of FIG. 1, an $n^-$-type silicon carbide crystal layer 2 as a first conductivity type silicon carbide crystal layer made from an n-type hexagonal silicon carbide crystal is epitaxially grown on a surface of an $n^+$-type silicon carbide crystal substrate 1 as a first conductivity type silicon carbide crystal substrate made from the n-type hexagonal silicon carbide crystal, whose principal surface is a carbon surface of a (0001−) crystal face. In the present invention, the (0001−) crystal face indicates a crystal face that is inclined at an angle not more than ±8° with respect to the (0001−) crystal face (including a crystal face that is not inclined with respect to the (0001−) crystal face). The carrier concentration of $n^+$-type silicon carbide crystal substrate 1 is higher than that of $n^-$-type silicon carbide crystal layer 2.

Figure 2:
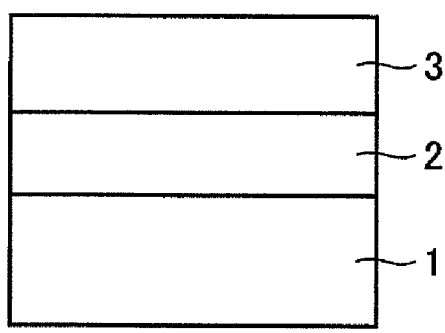
FIG. 2 is a schematic cross-sectional view showing a part of a manufacturing process of a preferable example of a trench-gate power MOSFET as a silicon carbide semiconductor device of the present invention.
Figure 3:
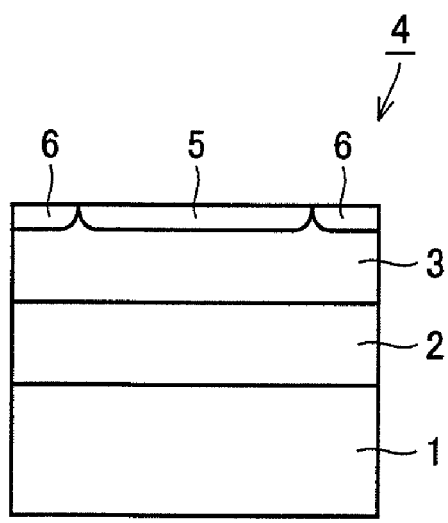
FIG. 3 is a schematic cross-sectional view showing a part of a manufacturing process of a preferable example of a trench-gate power MOSFET as a silicon carbide semiconductor device of the present invention.

Next, as shown in a schematic cross-sectional view of FIG. 2, a p-type silicon carbide crystal layer 3 as a second conductivity type silicon carbide crystal layer made from a p-type hexagonal silicon carbide crystal is epitaxially grown on a surface of $n^-$-type silicon carbide crystal layer 2. Then, as shown in a schematic cross-sectional view of FIG. 3, an $n^+$-type source region 5 as a first conductivity type semiconductor region is formed in a part of a surface of p-type silicon carbide crystal layer 3, for example by nitrogen ion implantation or the like. Furthermore, a $p^+$-type region 6 is formed in a portion of the surface of p-type silicon carbide crystal layer 3 where $n^+$-type source region 5 is not formed, for example by aluminum ion implantation or the like. Thus, a semiconductor stacked substrate 4 is formed. It should be noted that the carrier concentration of p⁺-type region 6 is higher than that of p-type silicon carbide crystal layer 3.

Figure 4:
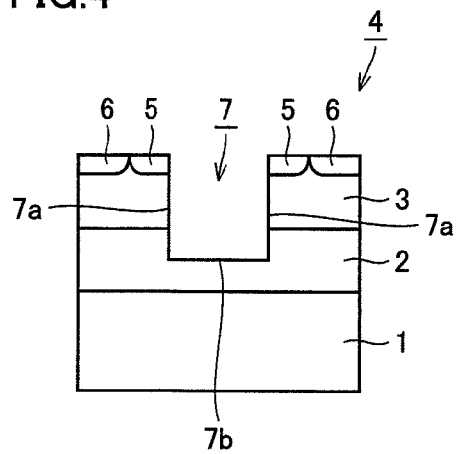
FIG. 4 is a schematic cross-sectional view showing a part of a manufacturing process of a preferable example of a trench-gate power MOSFET as a silicon carbide semiconductor device of the present invention.

Then, as shown in a schematic cross-sectional view of FIG. 4, a trench 7 is formed by RIE representing a dry etching method, that extends through both n⁺-type source region 5 and p-type silicon carbide crystal layer 3 to reach n⁻-type silicon carbide crystal layer 2 and has a bottom surface 7b defined by the surface of n⁻-type silicon carbide crystal layer 2. Here, it is preferable to form trench 7 such that side surfaces 7a of the trench are parallel to a [11-00] direction. In the present invention, in order to form trench 7 such that side surfaces 7a of the trench are parallel to the [11-00] direction, trench 7 has only to be formed such that side surfaces 7a of the trench are parallel to any one of the six directions of <11-00>, <101-0>, <011-0>, <1-100>, <1-010>, and <01-10>. Furthermore, in the present invention, being parallel to the [11-00] direction indicates being inclined at an angle not more than ±8° with respect to any one of the above-described six directions (including the case where the above-described angle is 0°.

Figure 5:
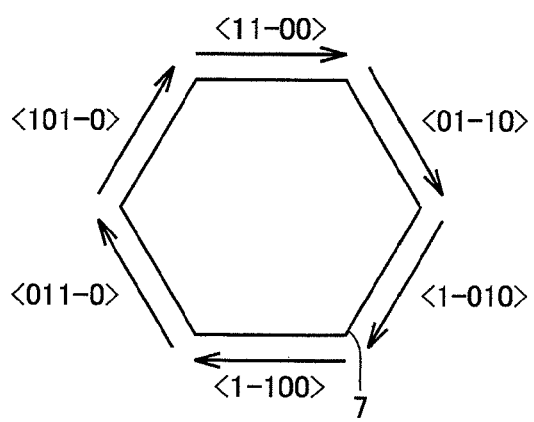
FIG. 5 is a schematic plan view of a preferable example of a two-dimensional shape of a trench formed in the present invention.

When trench 7 is formed such that side surfaces 7a of the trench are parallel to the [11-00] direction, trench 7 in the surface of semiconductor stacked substrate 4 has a hexagonal two-dimensional shape whose interior angles are equal to one another, for example as shown in a schematic plan view of FIG. 5. In the present invention, a hexagon whose interior angles are equal to one another indicates a hexagon in which an absolute value of a difference between a maximum interior angle and a minimum interior angle is not more than 32°.

Figure 6:
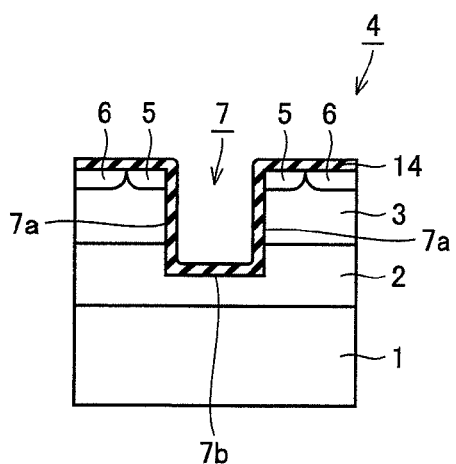
FIG. 6 is a schematic cross-sectional view showing a part of a manufacturing process of a preferable example of a trench-gate power MOSFET as a silicon carbide semiconductor device of the present invention.

Then, as shown in a schematic cross-sectional view of FIG. 6, a silicon film 14 is formed on the surface of semiconductor stacked substrate 4. Here, side surfaces 7a of trench 7 are covered with silicon film 14. Silicon film 14 can be formed, for example, by a sputtering method.

Then, semiconductor stacked substrate 4 having silicon film 14 formed is heated to a temperature that is not less than the melting temperature of silicon film 14. Here, a crystal face forming side surfaces 7a of trench 7 is reconfigured and side surfaces 7a of trench 7 tend to become a crystal face that is stable in terms of energy. In other words, by performing the steps of heating silicon film 14 formed on side surfaces 7a of trench 7 to a temperature that is not less than the melting temperature of silicon film 14 and reconfiguring the crystal face forming side surfaces 7a of trench 7, even if the crystal face is shifted and/or damaged at side surfaces 7a of trench 7, the shift and/or damage of the crystal face can be recovered. Therefore, in the present invention, creation of a surface level due to the shift and/or damage of the crystal face in a channel can be reduced, and thus the mobility of carriers in the channel can be improved.

In the present invention, from the viewpoint of the improvement in the mobility of the carriers in the channel of the silicon carbide semiconductor device, it is preferable to heat semiconductor stacked substrate 4 having silicon film 14 formed on side surfaces 7a of trench 7 at a temperature that is not less than 1300° C. and not more than 1700° C. Furthermore, in the present invention, from the viewpoint of the improvement in the mobility of the carriers in the channel of the silicon carbide semiconductor device, it is preferable to heat semiconductor stacked substrate 4 having silicon film 14 formed on side surfaces 7a of trench 7, preferably at a temperature that is not less than 1300° C. and not more than 1700° C. for 20 minutes or longer.

Figure 7:
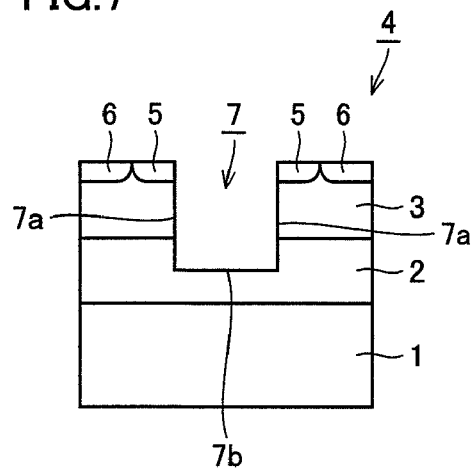
FIG. 7 is a schematic cross-sectional view showing a part of a manufacturing process of a preferable example of a trench-gate power MOSFET as a silicon carbide semiconductor device of the present invention.

As shown in a schematic cross-sectional view of FIG. 7, above-described heated silicon film 14 formed on the surface of semiconductor stacked substrate 4 is removed. Here, silicon film 14 is removed by immersion, for example, into a mixture of nitric acid and hydrogen fluoride or the like.

Figure 8:
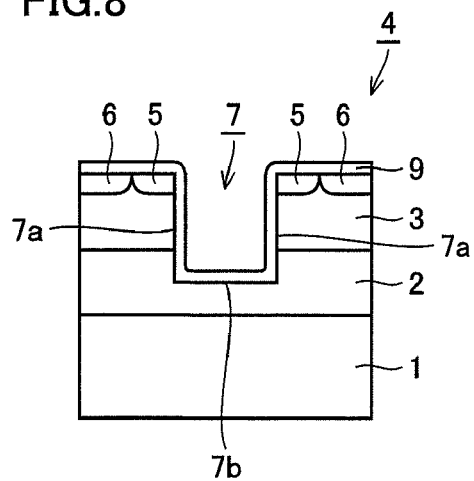
FIG. 8 is a schematic cross-sectional view showing a part of a manufacturing process of a preferable example of a trench-gate power MOSFET as a silicon carbide semiconductor device of the present invention.

Then, as shown in a schematic cross-sectional view of FIG. 8, a gate insulating film 9 is formed such that the surface of semiconductor stacked substrate 4, side surfaces 7a of trench 7 and bottom surface 7b of trench 7 are covered.

Figure 9:
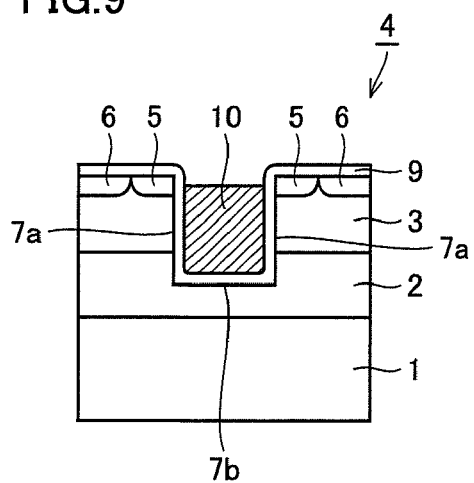
FIG. 9 is a schematic cross-sectional view showing a part of a manufacturing process of a preferable example of a trench-gate power MOSFET as a silicon carbide semiconductor device of the present invention.
Figure 10:
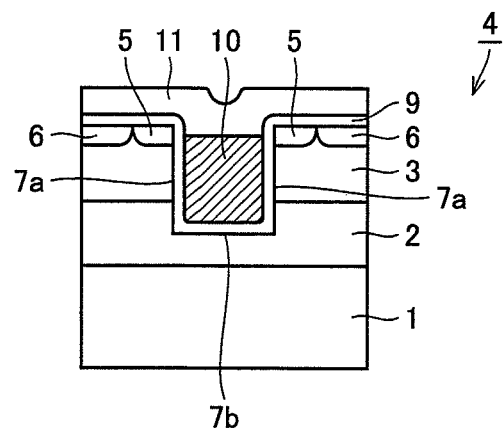
FIG. 10 is a schematic cross-sectional view showing a part of a manufacturing process of a preferable example of a trench-gate power MOSFET as a silicon carbide semiconductor device of the present invention.

Then, as shown in a schematic cross-sectional view of FIG. 9, a gate electrode layer 10 is formed inside gate insulating film 9 in trench 7. Thereafter, as shown in a schematic cross-sectional view of FIG. 10, an interlayer insulating film 11 is formed on the surface of semiconductor stacked substrate 4 as well as on gate electrode layer 10.

Figure 11:
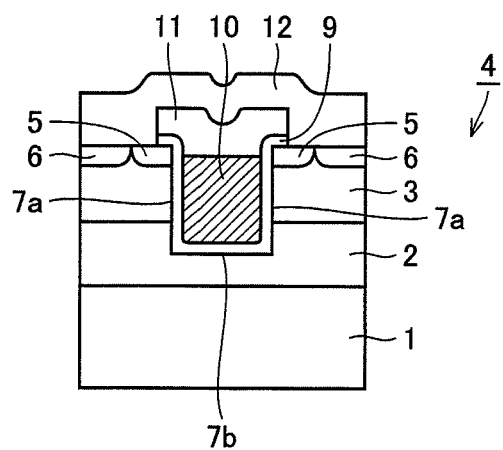
FIG. 11 is a schematic cross-sectional view showing a part of a manufacturing process of a preferable example of a trench-gate power MOSFET as a silicon carbide semiconductor device of the present invention.
Figure 12:
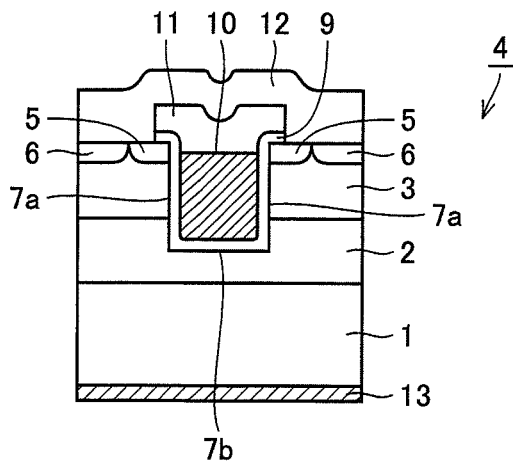
FIG. 12 is a schematic cross-sectional view of a preferable example of a trench-gate power MOSFET as a silicon carbide semiconductor device of the present invention.

After a part of gate insulating film 9 and interlayer insulating film 11 is removed, a source electrode layer 12 is formed on n⁺-type source region 5 and p⁺-type region 6 as well as on interlayer insulating film 11 as shown in a schematic cross-sectional view of FIG. 11. Then, as shown in a schematic cross-sectional view of FIG. 12, a drain electrode layer 13 is formed on a back surface of semiconductor stacked substrate 4 (a back surface of n⁺-type silicon carbide crystal substrate 1). Thus, a trench-gate power MOSFET as an example of a silicon carbide semiconductor device of the present invention is completed.

In the trench-gate power MOSFET as an example of a silicon carbide semiconductor device of the present invention obtained in the above-described manner, a surface exposed after the heated silicon film is removed can have a crystal face with reduced nonuniformity and/or damage as well as reduced surface level, and thus the mobility of the carriers in the channel implemented by such crystal face can be improved.

As a result, the surface level density in the channel can be controlled to be low and a trench-gate power MOSFET having excellent properties such as low on-resistance can be fabricated.

In the present invention, materials for gate electrode layer 10, source electrode layer 12 and drain electrode layer 13 are not particularly limited as long as they are conductive. In addition, materials for interlayer insulating film 11 are not particularly limited as long as they are insulating.

Although p⁺-type region 6 is formed in the foregoing, p⁺-type region 6 may not be formed in the present invention.

Although side surfaces 7a of trench 7 are formed perpendicular to the surface of semiconductor stacked substrate 4 in the foregoing, side surfaces 7a of trench 7 and the surface of semiconductor stacked substrate 4 may not necessarily form a vertical angle in the present invention.

Figure 13:
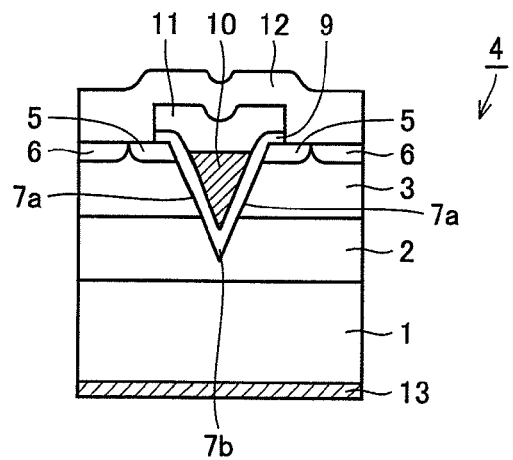
FIG. 13 is a schematic cross-sectional view of another preferable example of a trench-gate power MOSFET as a silicon carbide semiconductor device obtained by the present invention.
Figure 14:
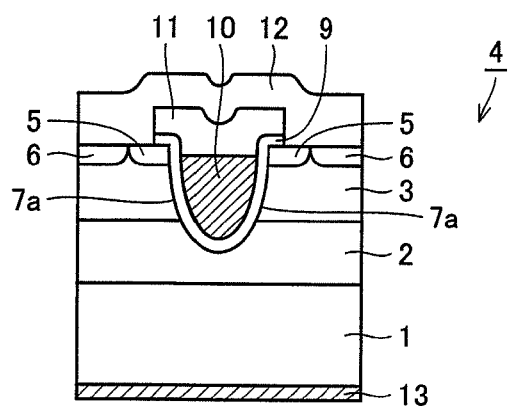
FIG. 14 is a schematic cross-sectional view of another preferable example of a trench-gate power MOSFET as a silicon carbide semiconductor device obtained by the present invention.

In the present invention, trench 7 may be V-shaped without having bottom surface 7b, for example as shown in a schematic cross-sectional view of FIG. 13. In addition, in the present invention, side surface 7a of trench 7 may be curved, for example as shown in a schematic cross-sectional view of FIG. 14.

Figure 15:
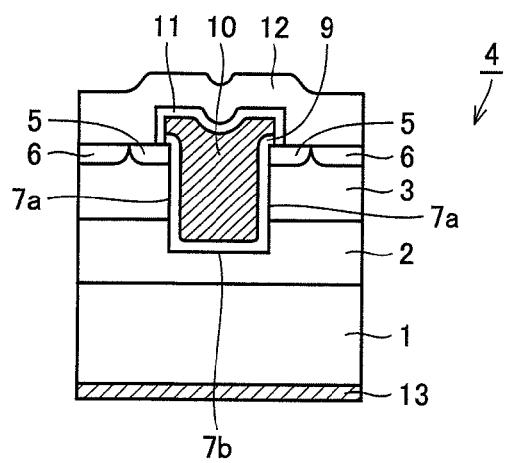
FIG. 15 is a schematic cross-sectional view of another preferable example of a trench-gate power MOSFET as a silicon carbide semiconductor device obtained by the present invention.
Figure 16:
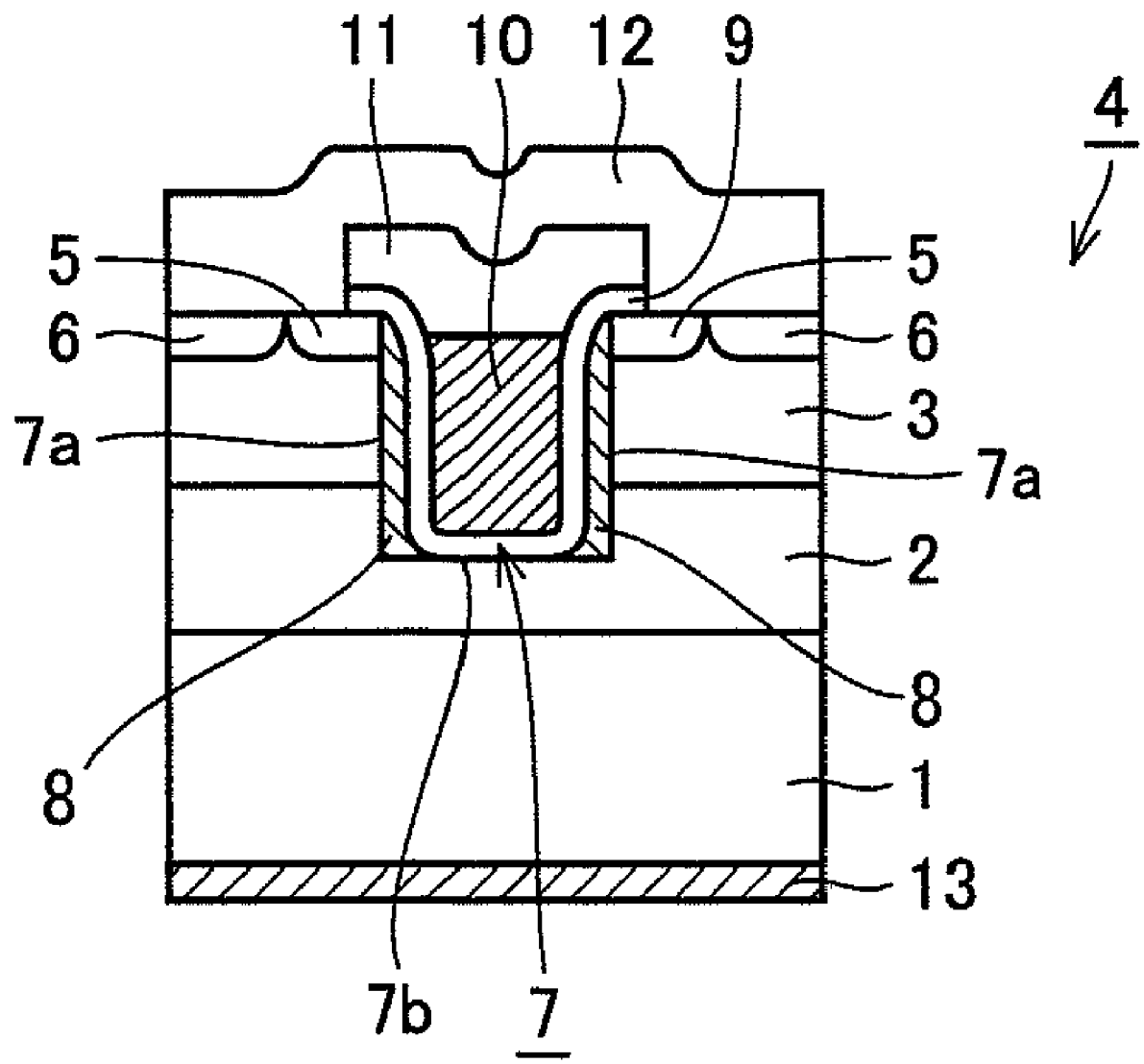
FIG. 16 is a schematic cross-sectional view of a conventional trench-gate power MOSFET.

In the present invention, gate electrode layer 10 may be formed in such a shape that at least a part of an upper portion of gate electrode layer 10 is located above n⁺-type source region 5, for example as shown in a schematic cross-sectional view of FIG. 15.

In the present invention, all of the above-described conductivity types of n-type and p-type may be reversed. Although crystal faces and directions should be represented essentially by putting bars over required numerals, they are represented herein by putting "-" after the required numerals, instead of putting bars over the required numerals, because a method of representing them is restricted.

It should be understood that the embodiments disclosed herein are illustrative and not limitative in any respect. The scope of the present invention is defined by the terms of the claims, rather than the description above, and is intended to include any modifications within the scope and meaning equivalent to the terms of the claims.

INDUSTRIAL APPLICABILITY

According to the present invention, there can be provided a method of manufacturing a silicon carbide semiconductor device having excellent properties such as low on-resistance with the improved mobility of carriers in a channel.

The invention claimed is:

1. A method of manufacturing a silicon carbide semiconductor device, comprising the steps of:

in a semiconductor stacked substrate including a first conductivity type silicon carbide crystal substrate made from a hexagonal silicon carbide crystal of a first conductivity type, a first conductivity type silicon carbide crystal layer made from a hexagonal silicon carbide crystal of a first conductivity type and formed on said first conductivity type silicon carbide crystal substrate, a second conductivity type silicon carbide crystal layer made from a hexagonal silicon carbide crystal of a second conductivity type and formed on said first conductivity type silicon carbide crystal layer, and a first conductivity type semiconductor region formed in a surface of said second conductivity type silicon carbide crystal layer, forming a trench extending from a surface of said semiconductor stacked substrate through said first conductivity type semiconductor region and said second conductivity type silicon carbide crystal layer into said first conductivity type silicon carbide crystal layer defined as a bottom surface;

forming a silicon film in at least a part of said trench;

heating said semiconductor stacked substrate having said silicon film formed to a temperature that is not less than a melting temperature of said silicon film;

removing heated said silicon film;

forming a gate insulating film on a surface exposed after said silicon film is removed; and forming a gate electrode layer on a surface of said gate insulating film.

2. The method of manufacturing a silicon carbide semiconductor device according to claim 1, wherein said trench is formed such that side surfaces of said trench are parallel to a [11-00] direction.

3. The method of manufacturing a silicon carbide semiconductor device according to claim 1, wherein said trench is formed in a hexagonal shape whose interior angles are equal to one another in the surface of said semiconductor stacked substrate.

* * * * *